United States Patent
Tanase et al.

(10) Patent No.: US 10,294,559 B2
(45) Date of Patent: May 21, 2019

(54) TARGET COOLING THROUGH GUN DRILLED HOLES

(75) Inventors: Yoshiaki Tanase, San Jose, CA (US); Makoto Inagawa, Palo Alto, CA (US); Akihiro Hosokawa, Cupertino, CA (US)

(73) Assignee: Applied Materials, Inc., Santa Clara, CA (US)

(*) Notice: Subject to any disclaimer, the term of this patent is extended or adjusted under 35 U.S.C. 154(b) by 635 days.

(21) Appl. No.: 13/420,996

(22) Filed: Mar. 15, 2012

(65) Prior Publication Data

US 2012/0175250 A1    Jul. 12, 2012

Related U.S. Application Data

(63) Continuation of application No. 11/190,389, filed on Jul. 27, 2005, now Pat. No. 8,182,661.

(51) Int. Cl.
*C23C 14/34* (2006.01)
*H01J 37/34* (2006.01)

(52) U.S. Cl.
CPC ...... *C23C 14/3407* (2013.01); *H01J 37/3408* (2013.01); *H01J 37/3497* (2013.01); *Y10T 29/49826* (2015.01)

(58) Field of Classification Search
USPC ............ 204/298.09; 118/69; 156/345.53; 165/168, 177
See application file for complete search history.

(56) References Cited

U.S. PATENT DOCUMENTS

| | | | |
|---|---|---|---|
| 4,079,410 A * | 3/1978 | Schierz | 257/714 |
| 4,361,749 A | 11/1982 | Lord | |
| 5,328,585 A * | 7/1994 | Stevenson et al. | 204/298.2 |
| 5,565,071 A | 10/1996 | Demaray et al. | |
| 5,873,989 A * | 2/1999 | Hughes et al. | 204/298.2 |
| 5,985,115 A | 11/1999 | Hartsough et al. | |
| 6,113,754 A | 9/2000 | Oh et al. | |
| 6,264,812 B1 | 7/2001 | Raaijmakers et al. | |
| 6,315,030 B1 | 11/2001 | Poloni et al. | |
| 6,340,415 B1 | 1/2002 | Raaijmakers et al. | |
| 6,344,117 B2 | 2/2002 | Enomoto et al. | |
| 6,708,870 B2 | 3/2004 | Koenigsmann et al. | |
| 6,776,879 B2 | 8/2004 | Yamamoto et al. | |
| 2001/0047935 A1 | 12/2001 | Enomoto | |
| 2002/0174978 A1* | 11/2002 | Beddome et al. | 165/174 |
| 2005/0092604 A1 | 5/2005 | Ivanov | |

* cited by examiner

*Primary Examiner* — Jason Berman
(74) *Attorney, Agent, or Firm* — Charles S. Guenzer

(57) ABSTRACT

A sputter target assembly particularly useful for a large panel plasma sputter reactor having a target assembly sealed both to the main processing chamber and a vacuum pumped chamber housing a moving magnetron. The target assembly to which target tiles are bonded includes an integral plate with parallel cooling holes drilled parallel to the principal faces. The ends of the holes may be sealed and vertically extending slots arranged in two staggered groups on each side and machined down to respective pairs of cooling holes on opposite sides of the backing plate in pairs. Four manifolds tubes are sealed to the four groups of slots and provide counter-flowing coolant paths.

23 Claims, 5 Drawing Sheets

TARGET COOLING THROUGH GUN DRILLED HOLES

RELATED APPLICATION

This application is a continuation of Ser. No. 11/190,389, filed Jul. 27, 2005, incorporated herein by reference and now allowed.

FIELD OF THE INVENTION

The invention relates generally to sputtering apparatus. In particular, the invention relates to cooling of the sputtering target.

BACKGROUND ART

Sputtering is a well established technology in the fabrication of silicon integrated circuits, in which a metal target is sputtered to deposit target material onto the silicon wafer. Sputtering has also been applied to other uses, such as window coatings. In recent years, sputtering has also been applied for similar purposes as for silicon integrated circuits in the fabrication of flat panel displays, such as flat computer displays and large flat televisions and the like. Various types of flat panel displays may be fabricated typically including thin film transistors (TFTs) formed on large thin insulating rectangular substrates, often called panels, and including liquid crystal displays (LCDs), plasma displays, field emitters, and organic light emitting diodes (OLEDs).

A conventional flat panel sputter reactor 10 is schematically illustrated in the cross-sectional view of FIG. 1. Demaray et al. (hereafter Demaray) disclose more details of such a reactor in U.S. Pat. No. 5,565,071, incorporated herein by reference. A pedestal 12 within a main vacuum chamber 14 supports a rectangular panel 16 to be sputter coated in opposition to a generally rectangular target tile 18 bonded to a backing plate 20 sealed to but electrically isolated from the main chamber 14 by an isolator 22. The panel 16 may be composed of a glass, a polymeric material, or other material. The target material is most typically a metal such as aluminum, molybdenum, or indium tin oxide (ITO) although other metals may be freely substituted depending on the type of layer desired to be formed on the panel 16. Larger targets may require the bonding of multiple target tiles to the backing plate in one- or two-dimensional arrays. An unillustrated vacuum pump system pumps the interior of the main chamber 14 to a base pressure of $10^{-6}$ to $10^{-7}$ Torr or below. A gas source 24 supplies a sputter working gas such as argon into the chamber 14 through a mass flow controller 26 and the main chamber pressure is kept typically at no more than a few milliTorr during sputtering. A DC power supply 28 applies a negative DC bias of several hundred volts to the target 18 in opposition to the grounded pedestal 12 and unillustrated chamber shield to cause the argon to be excited into a plasma. The positively charged argon ions are attracted and accelerated by the negatively biased target 18 with sufficient energy to sputter atoms of the target material from it. Some of the sputtered material strikes the panel 16 and coat it with a thin layer of the target material. Optionally, a reactive gas such as nitrogen, may be additionally admitted to the chamber to cause the sputtered metal to react with it and form a metal compound such as a metal nitride on the panel surface.

Sputtering is greatly enhanced if a magnetron 30 having opposed magnetic poles is placed in back of the backing plate 20 to project a magnetic field B into the main chamber in front of the target 18. The magnetic field traps electrons and thus increases the density of the plasma adjacent the target 18, greatly increasing the sputtering rate. To achieve uniform erosion of the target 18 and uniform deposition on the panel 16, the magnetron 30 is scanned in a one- or two-dimensional pattern across the back of the backing plate 20. The form of the magnetron 30 may be much more complex than that illustrated.

Almost all panel fabrication equipment is distinguished by its large size. The original generation was based on panels having lateral dimensions of the order of 500 mm. Various economic and product factors have prompted successive generations of flat panel fabrication equipment of ever increasing sizes. The next generation is being developed to sputter deposit on panels having sides of greater than 2 m. This large size has introduced several problems not experienced in wafer fabrication equipment limited to sizes of about 300 mm in the most recent equipment.

The target 18 and more particularly its backing plate 20 must be relatively thin so that the magnetron 30 can project a substantial magnetic field through it. However, absent other means, the backing plate 20 needs to stand off a considerable force (differential pressure times the area) between its back and the high vacuum of the main chamber 14 and further the backing plate 20 should not significantly bow under these pressure differentials. To provide such large thin targets, Demaray proposed placing the magnetron 30 inside a magnetron chamber 32 sealed to the back of the backing plate 20 and pumped to a relatively low pressure in the sub-Torr range, the limit of a mechanical vacuum pump. Such back pumping reduces the force exerted on the backing plate 20 by a factor of about a thousand.

Such a structure contrasts with a conventional wafer sputter reactor in which a corresponding chamber at the back of the target backing plate 20 is filled with chilling water to cool the target during sputtering. Demaray, instead, recirculates cooling liquid from a chiller 34 through cooling channels formed within the backing plate 32. As shown in the cross-sectional view of FIG. 2, a substantially rectangular conventional target 40 includes a backing plate 42 formed of top and bottom plates 44, 46. Cooling channels 48 of generally rectangular cross section are machined into the surface of the top plate 44 to extend generally between the two sides of the backing plate 42 although larger horizontal distribution manifolds may be formed nearer the two sides to connect the cooling channels 48 to a common cooling liquid inlet and a common cooling liquid outlet. The bottom plate 46 is then bonded to the top plate 44 to enclose and seal the cooling channels 48 and manifolds. A target tile 50 is then bonded to the backing plate 42. In the past, indium bonding was most often used but conductive polymeric adhesive bonding is gaining favor.

The bonding of the two plates 46, 48 of the backing plate 42 has presented technical challenges, particularly at the larger panel sizes. It is desired to reuse the backing plate 42 when sputtering has effectively eroded through the target tile 50. That is, it is desired to remove the old target tile 50 and replace it with a new one. The backing plate 42 needs to be rugged to survive refurbishment when the used target tile is delaminated from the backing plate and a new target tile is laminated. Targets and their backing plates have become increasingly expensive for the larger sizes of panels. Thus, their cost should be reduced while their ruggedness should be maintained and preferably increased. The two plates 44, 46 can be welded together, but welding tends to deform thin plates. The two plates 44, 46 can be screwed together with a sealant placed in the interface. However, the number of screws required for a 2.5 m×2.5 m target becomes very large. Indium bonding can be used, but its ruggedness is questionable. Autoclaving has been suggested, but this is a complex and expensive process.

The larger target sizes have also presented a challenge in uniformly cooling a larger area without unduly increasing the thickness of the target assembly.

SUMMARY OF THE INVENTION

One aspect of the invention includes a sputtering target backing plate to which one or more target tiles are bonded and which has parallel laterally extending cooling holes formed parallel to the principal surface of the backing plate for the flow of cooling water or other liquid. The backing plate is preferably integral and cylindrical cooling holes may be bored across its lateral dimension, for example, by gun drilling.

Another aspect of the invention includes dividing the cooling holes into two interleaved groups and counter-flowing cooling liquid in the two groups of cooling holes, that is, in anti-parallel directions to thereby reduce the temperature differential across the target and its backing plate.

A further aspect of the invention includes vertical inlet and outlet holes or slots formed from a principal surface of the backing plate on two opposed peripheral sides and each joined to one or more of the cooling holes to supply and drain cooling liquid from the horizontally extending cooling holes. The inlet and outlet holes thus extend along respective axes extending through and at respective finite angles to the principal surface from which they are formed. The slots advantageously join two to six adjacent cooling holes The ends of the cooling holes outside of the vertical inlet and outlet holes are plugged. Advantageously, the holes or slots on each peripheral side alternate in offset along the axial direction of the cooling holes to provide alternating inlet and outlet holes or slots. Supply and drain manifolds may then be arranged in parallel and sealed to the respective inlet and outlet holes or slots.

DETAILED DESCRIPTION OF THE PREFERRED EMBODIMENTS

Figure 3:
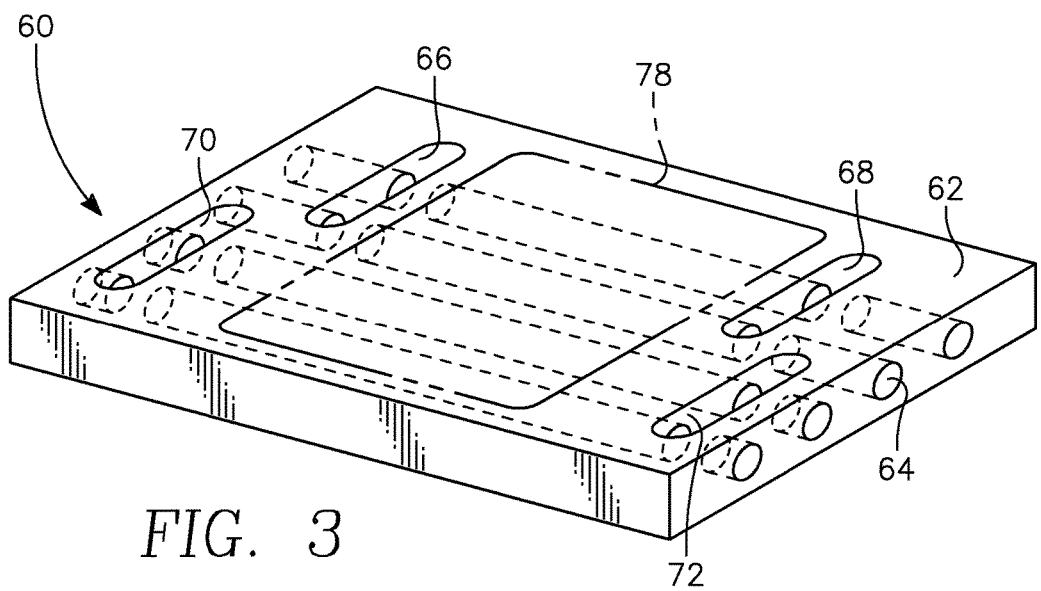
FIG. 3 is a schematic orthographic view of a simplified embodiment of a backing plate of the invention.

A backing plate 60 of one embodiment of the invention, very schematically illustrated in the orthographic view of FIG. 3 from the bottom, is formed in an integral metal plate 62 having lateral dimensions corresponding to the desired size of the backing plate 60, for example, greater than 2 m on a side for the planned next generation. A series of parallel cylindrical cooling holes 64 are bored to extend from one lateral side to the opposed other lateral side of the metal plate 62 and parallel to the principal surfaces of the metal plate 62. The two opposed lateral sides are also called lateral side surfaces. Exemplary dimensions are a thickness for an aluminum plate of 33 mm and hole diameter of 12 mm. The hole boring over such a great distance may be achieved by gun drilling, that is, using a very long drill bit. In view of the long lengths, it is advantageous to drill holes from both sides which join in the middle. The cooling water or other liquid flows through the holes 64 to cool the backing plate 60 and hence the target tile affixed to the backing plate 60.

Figure 4:
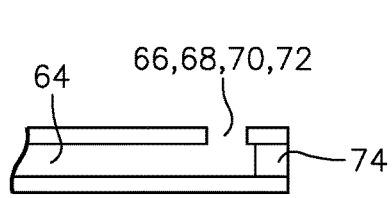
FIG. 4 is a cross-sectional view of a vertically extending cooling inlet or inlet to a horizontally extending cooling hole.

In the illustrated embodiment, cooling water is supplied and drained from elongated or oblong holes or slots 66, 68, 70, 72 milled from a principal surface of the metal plate 62 to preferably at least the median depth of the holes 64 but not to the opposite side of the metal plate 62. As a result, the cooling holes 64 are exposed to respective pairs of the slots 66, 68, 70, 72. The slots 66, 68, 70, 72 are located in two sets on opposed lateral sides of the metal plate 62 at positions outside of the vacuum chamber 14 and the magnetron chamber 32 to which the backing plate 60 will be sealed. For convenience of plumbing connections, the slots are preferably located on the illustrated bottom side of the backing plate 60 to which the target tile will be bonded. Machining and sealing are simplified if the slots 66, 68, 70, 72 expose pairs of the cooling holes 64. The slots may be formed as circular holes, especially if they expose only one respective cooling hole but elongated slots linked to multiple cooling holes 64 are advantageous. More than two cooling holes 64 per slot would further simplify the machining and sealing but at the cost of degraded cooling uniformity. Generally, six cooling holes 64 per slot are a reasonable upper limit. As illustrated in the cross-sectional view of FIG. 4, the ends of cooling holes 64 laterally outside of the slots 66, 68, 70, 72 are water sealed with plugs 74 so that the water flows from slot to slot on opposed sides of the backing plate 60 through the middle portion of the cooling holes 64.

The material of the backing plate 60 is not limited to aluminum or aluminum alloys but, in view of the gun drilling, it is preferred that the material be easily machinable, such as aluminum or brass.

It is preferred that the cooling water or other liquid coolant be supplied to and drained from the slots to set up counter flowing coolant. For example, slot 66 can serve as in inlet and slot 68 as an outlet for coolant flowing to the right and slot 72 can serve as an inlet and slot 70 as an outlet for coolant flowing to the left. The counter flow greatly reduces the temperature differential across the backing plate 60 when there are many more anti-parallel flowing groups of cooling holes 64. It is typical for cooling water to heat up from about 20° C. to 25° C. in one pass across the backing plate 60 under normal sputtering conditions. For single directional flow, the backing plate 60 would have a similar 5° C. temperature differential from one side to the other, which amounts to a differential thermal expansion of about 1 mm in aluminum, a value which should be reduced. On the other hand, for counter flowing coolant neighboring pairs of cooling holes 64 have an opposite temperature gradient and they are close enough that the backing plate 60 is substantially cooled to the average of the two flows, that is, a nearly constant 22.5° C. as averaged over the area between the counter-flowing holes although more localized but compensating temperature variations will occur.

Figure 5:
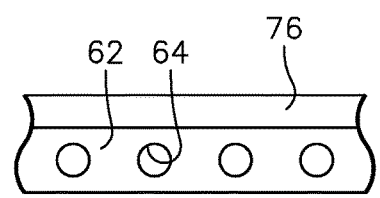
FIG. 5 is a cross-sectional view of a plurality of horizontally extending cooling holes formed in a target backing plate.

As illustrated in the cross-sectional view of FIG. 5, one or more target tiles 76 are bonded to the bottom side of the backing plate 60 (top as illustrated) in a target area 78 of FIG. 3 adjacent the cooling holes 64 and between the slots 66, 68, 72, 72 providing coolant to them.

Figure 6:
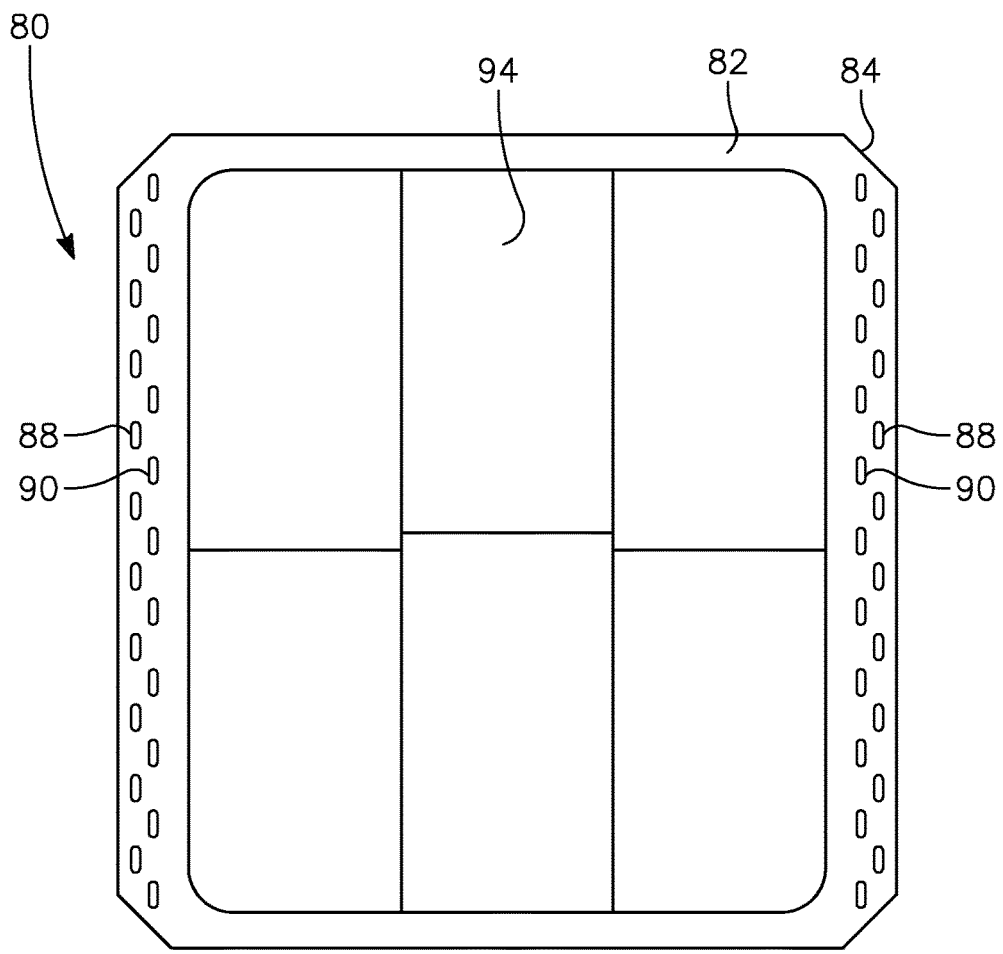
FIG. 6 is a bottom plan view of a multi-tile target and backing plate of the invention including four columns of cooling inlets and outlets.
Figure 7:
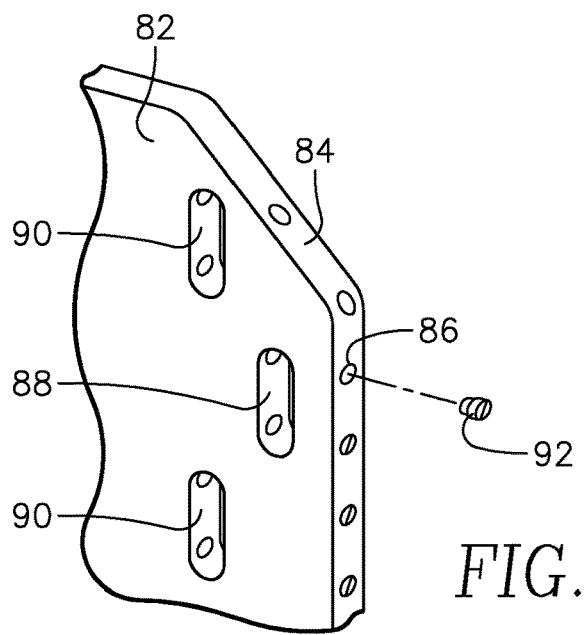
FIG. 7 is an exploded orthographic view of a corner of the target backing plate of FIG. 6 including

The illustration of the backing plate 60 of FIG. 3 is very simplified. A more realistic target and backing plate assembly 80, illustrated in the bottom plan view of FIG. 6, includes an integral backing plate 82 with angled corners 84, which are illustrated in more detail in the exploded orthographic view of FIG. 7. It includes 42 parallel cooling holes 86 in alternating pairs for the counterflow. The cooling holes 86 may be are gun drilled from the opposed edges of the backing plate 82 including the angled corners 84. Exemplary dimensions are a thickness for an aluminum or aluminum alloy plate 82 of 33 mm and a hole diameter of 12 mm, that is, a hole diameter of preferably greater than 25% and less than 75% and preferably less than 50% of the plate thickness. The plate thickness may be varied, for example, between 20 and 60 mm. Slots 88, 90 are machined from the bottom operational surface of the backing plate 82 in two staggered columns on each side to expose pairs of the cooling holes 88. Plural, for example, 10 sets of coupled slots 88 and plural, for example, 11 sets of coupled slots 90 provide the pair-wise coupling of the slots 88, 90 to the cooling holes 86. As mentioned above, number of cooling holes 88 exposed by a single slot 88, 90 may vary. Also, the number of slot sets may be varied but cooling uniformity is improved by increasing the number of sets. Plugs 92 are screwed into or otherwise sealed to both ends of the holes 88, 90 so that all coolant flows through the slots 88, 90. The plugs 92 may chosen from various commercially available types, for example, Swageloks, Farmington plugs, SAE plugs or they may be specially fabricated. A welded rod plug is also possible although warpage should be avoided.

The described embodiment evenly spaces the cooling holes 86 and slots 88, 90 across the backing plate 82. However, non-uniform distributions may be used to tailor the cooling, for example, more cooling holes and hence more cooling in the center of the backing plate 82.

The described fabrication technique for an integral backing plate with cooling holes bored laterally therethrough provides several advantages. The fabrication based mostly on machining is much less expensive than the previously practiced bonding of multiple plates. Even if the diameter of the holes is a sizable fraction of the plate thickness, they do not greatly reduce the plate's rigidity. Furthermore, the resultant backing plate is not subjected to delamination during usage or target refurbishment.

After fabrication of the backing plate 82, target tiles 94 are bonded to the backing plate 82, preferably with a conductive polymeric adhesive in a process available from TCB of San Jose, Calif. although conventional indium bonding or other method may be used. The illustration shows multiple tiles 94 in a two-dimensional array with predetermined gaps of about 0.5 mm between them, a useful arrangement if large target tiles are not readily available. However, other tile arrangements may be used such as a one-dimension array of multiple tiles or a single large tile.

Figure 8:
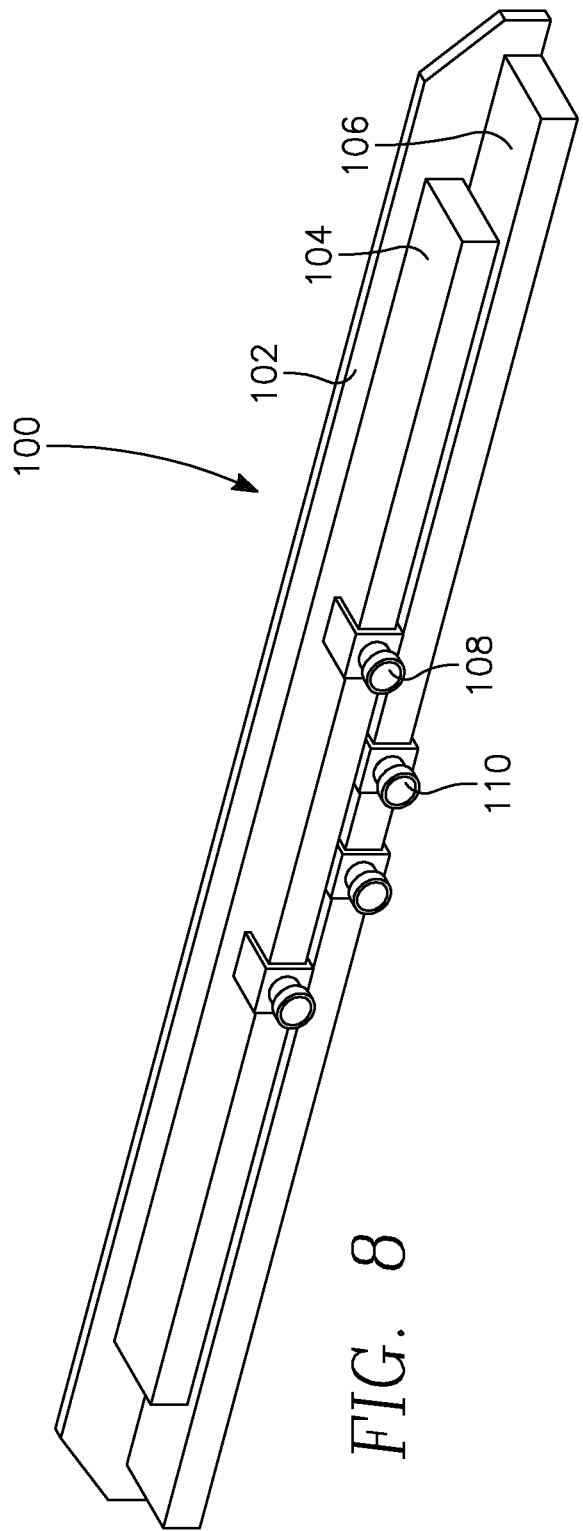
FIG. 8 is an orthographic view of an embodiment of one of two cooling manifolds to be attached to the backing plate of FIG. 6.

Two manifolds 100, one of which is illustrated in the orthographic view of FIG. 8 generally from the bottom in their operational position, are attached to the opposed sides of the backing plate 82 on its operational bottom side to cover and couple to the offset rows of slots 88, 90. Advantageously, they can easily formed of stainless steel without affecting the cleanliness within the sputtering chamber. Each manifold 100 includes a manifold plate 102 and a short rectangular manifold tube 104 and a long rectangular manifold tube 106, each having respective pairs of hose fittings 108, 110 for the supply and draining of cooling water or other liquid coolant through unillustrated hoses to the chiller 34. Multiple holes fittings 108, 110 mounted on and coupled to the interiors of each manifold tube 104, 106 provide a more uniform flow of coolant to each of the large number of slots 88, 90 and associated cooling holes 86. The two manifold tubes 104, 106 are welded from within each of the manifold plate slots 112, 114 between the slot periphery and the manifold plate 106. When welded, the two manifold tubes 104, 106 are separated by about 1 cm between them to allow screwing of fasteners between the manifold plate 106 and the backing plate 82 in the area between the manifold tubes 104, 106.

Figure 9:
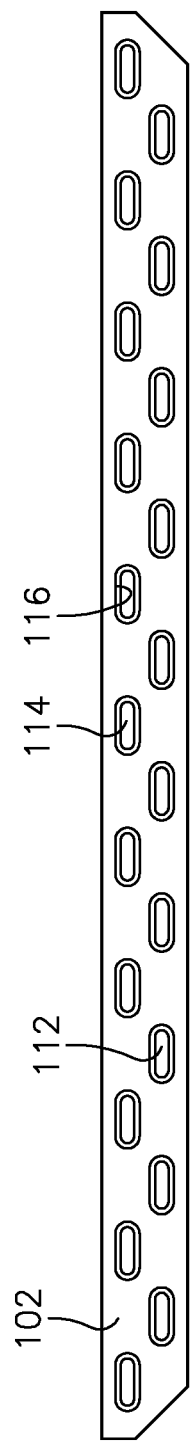
FIG. 9 is a plan view of a planar side of a manifold plate forming part of the manifold of FIG. 8.

The manifold plate 102, as shown in the top plan view of FIG. 9 includes two staggered rows of manifold slots 112, 114 in correspondence to the slots 88, 90 in the backing plate 82. O-ring grooves 116 surround each of the manifold slots 112, 114 to accept respective O-rings used to seal the manifold 100 and its slots 112, 114 to the backing plate 82 around its slots 88, 90. The bases of the manifold tubes 104, 106 have corresponding slots machined into them to allow cooling liquid to freely circulate between the manifold tubes 104, 106 and the corresponding groups of the cooling holes 86. Three rows of unillustrated through holes bored through the manifold plate 102 match corresponding unillustrated tapped holes in the backing plate 82 for screw attachment and sealing of the manifold 100 to the backing plate 82. The through and tapped holes are arranged such that four screws are fastened in a rectangular pattern around each of the manifold slots 112, 114 to uniformly seal the O-rings 116.

Figure 10:
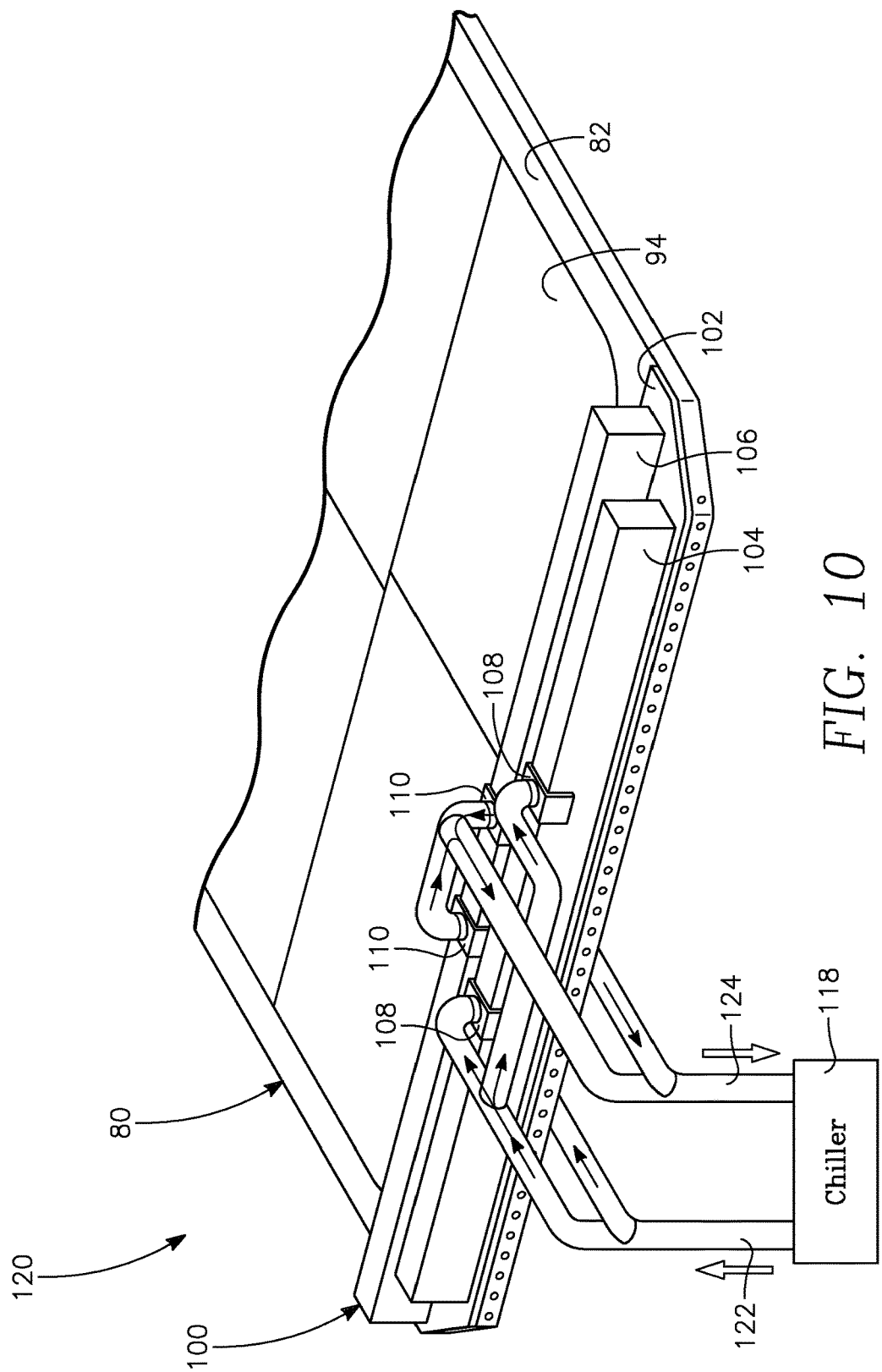
FIG. 10 is an orthographic view of the backing plate of FIG. 6 to which are attached two manifolds of FIG. 8.

An operational target assembly 120 is illustrated in the partial orthographic view of FIG. 10 generally from the bottom in it operational orientation. The operational target assembly 120 includes the target and backing plate assembly 80 of FIG. 8 and two manifolds 100 of FIG. 8 (only one of which is illustrated) fixed and sealed to two opposed peripheral sides of the backing plate 82 outside of its vacuum seals to the main and magnetron chambers 14, 32. The operational target assembly 120 additionally includes a multi-branch supply hose 122 and a multi-branch drain hose 124 connected between a chiller 118 and the hose fittings 108, 110 on both lateral sides of the backing plate 82. On the illustrated manifold 100, the supply hose 122 supplies chilled coolant to the short manifold tube 106 while the drain hose 124 drains coolant warmed by the target from the long manifold tube 106. The double hose connection to each manifold tube 104, 106 evens the flow between the large number cooling holes. In contrast, on the unillustrated manifold 100 fixed to the other unillustrated lateral side of the target 80 with similar hose fittings 108, 110, the supply hose 122 supplies chilled coolant to the long tube manifold tube 106 through the two hose fittings 110 and the drain hose 124 drains warmed coolant from the short manifold tube 104 through the two hose fittings 108. As a result, a first coolant flow is set up in one direction between the two short manifold tubes 104 and a second coolant flow is set up in the opposite direction between the two long manifold tubes 106.

The external manifolds provide several advantages of their own. They can be manufactured separately from the target assembly and can be easily reused. Furthermore, in combination with the large number of parallel cooling holes, they enable a more uniform cooling of the target.

An alternative embodiment includes a single row of backing plate slots 88, 90 on both principal surfaces of the backing plate 82 and on both its lateral sides connecting to different ones of the cooling holes 64. Separate liquid manifolds may be affixed to the top and bottom of the backing plate 82. This configuration reduces the length of the backing plate. Yet other forms of the manifolds are included within the invention.

Figure 1:
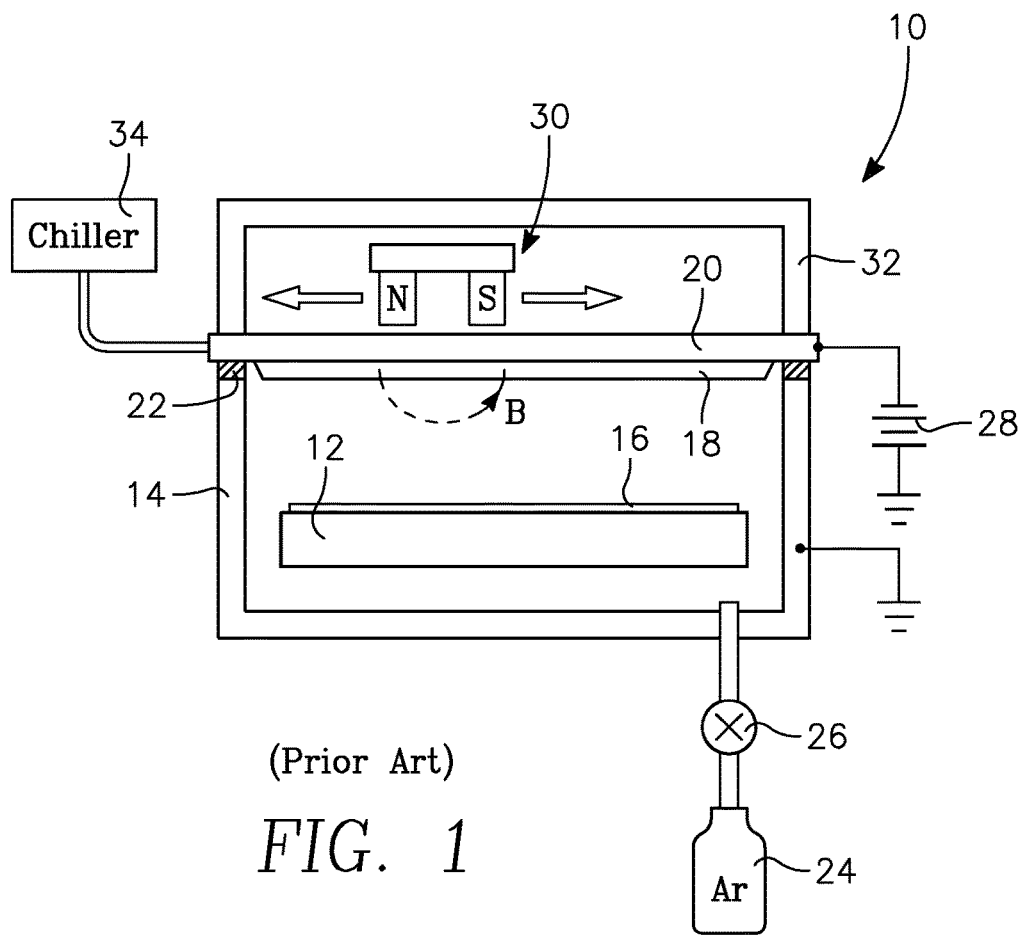
FIG. 1 is a schematic cross-sectional view of a conventional flat panel sputtering chamber.
Figure 2:
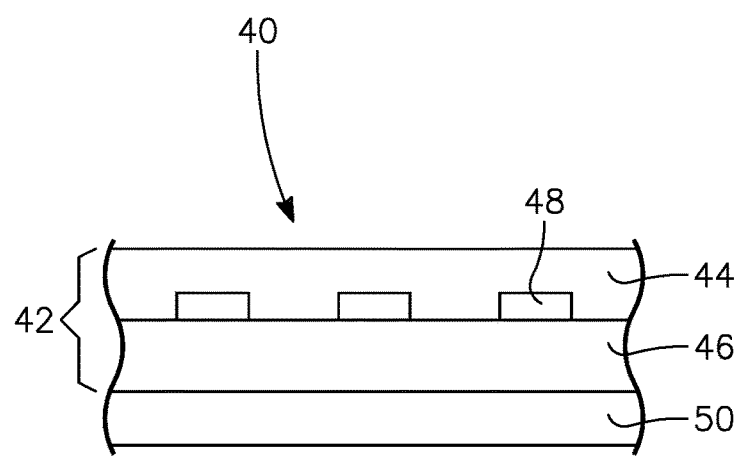
FIG. 2 is a cross-sectional view of a conventional target including a backing plate with cooling channels and a target tile bonded to it.

Although the above embodiments have been described with respect to the orientations of the sputter chamber of FIG. 1, it is clear that the orientation may be inverted, put on its side, or arranged at another angle without departing the spirit of the invention. The directions recited in the claims are for convenience only and may be changed to other orientations with respect to gravitational force.

The invention is not limited to sputtering onto panels intended for displays but may be applied to other applications.

The several features of the invention may be practiced separately or in combination and with limitations restricted only by the claims.

The invention thus provides a less expensive, more rugged target assembly and reusable backing plate providing improved thermal control.

The invention claimed is:

1. A sputtering target, comprising:
   a backing plate formed in a metal plate having two parallel principal surfaces and including a plurality of cooling channels formed in parallel cooling holes which extend laterally parallel to a common axis from a first lateral side surface to an opposed second lateral side surface of the metal plate and which are formed in the metal plate with inner portions that are cylindrically shaped;
   a plurality of inlet and a plurality of outlet holes extending only along respective flow axes from at least one of the principal surfaces to respective pluralities of the cooling holes; and
   one or more sputtering target tiles bonded to one of the two principal surfaces in a target area of the backing plate underlain by the inner portions of the cooling holes.

2. The target of claim 1, wherein the backing plate is an integral plate formed without bonding of multiple members to form the backing plate, wherein the principal surfaces are planar.

3. The target of claim 1, wherein the inlet holes are adapted to be coupled to at least one liquid cooling supply line and the outlet holes are adapted to be coupled to at least one liquid cooling drain line.

4. A sputtering target, comprising:
   a backing plate formed in a metal plate having two parallel principal surfaces including one principal surface adapted to be bonded in a target area to one or more sputtering target tiles, the backing plate including a plurality of parallel cooling channels formed in cooling holes formed in the metal plate having at least portions that are cylindrically shaped and underlie the target area and which cooling holes extend laterally parallel to a common axis from a first lateral side surface of the metal plate to a second lateral side surface of the metal plate opposed to the first lateral side surface;
   sealing members extending along respective axes parallel to the common axis and fit in and sealing and plugging the cooling holes adjacent the opposed lateral surfaces; and
   inlet and outlet holes each extending only along respective flow axes extending through the one principal surface from at least one of the principal surfaces to respective pluralities of the cooling holes.

5. The target of claim 4, wherein the backing plate has a substantially rectangular shape.

6. The target of claim 4, wherein the sealing members are plugs screwed into ends of the cooling holes adjacent to the lateral edges of the metal plate.

7. The target of claim 4, wherein the inlet and outlet holes are disposed between the target area and outside edges of the backing plate.

8. The target of claim 4, wherein some of the inlet and outlet holes are coupled to the respective pluralities of the cooling holes in first alternating groups thereof on a first one of opposed lateral side regions of the backing plate across the target area and others of the inlet and outlet holes are coupled to other respective pluralities of the cooling holes in second alternating groups thereof on a second one of the opposed lateral side regions of the backing plate.

9. The target of claim 8, wherein the pluralities are between 2 and 6.

10. The target of claim 8, further comprising four liquid manifolds coupled to respective ones of two of the groups on the two opposed lateral side regions of the backing plate.

11. The target of claim 10, further comprising two manifold plates to which are fixed respective pairs of the liquid manifolds and which are detachably affixable to the backing plate.

12. The target of claim 4, wherein the inlet and outlet holes include elongate slots formed in the backing plate to have elongate cross sections in one of the principal surfaces of the backing plate and each communicating with the respective pluralities of the cooling holes.

13. The target of claim 4, wherein a planar portion of the metal plate between the inlet and outlet holes and the target area allows vacuum sealing to a vacuum chamber.

14. A sputtering chamber, comprising:
   the target of claim 7;
   a main vacuum chamber sealed to the backing plate with the sputtering target tiles facing the main vacuum chamber and including a pedestal facing the one or more sputtering target tiles for supporting a substrate to be sputter coated from the one or more sputtering target tiles; and
   a vacuum pumped magnetron chamber sealed to the backing plate on a side thereof opposite the one or more sputtering target tiles for accommodating a magnetron scanned adjacent the backing plate;
   wherein the inlet and outlet holes of the backing plate are disposed outside, toward lateral edges of the backing plate, of vacuum seals sealing the backing plate to the main vacuum chamber and to the magnetron chamber.

15. A sputtering target backing plate formed by the process comprising:
   drilling a plurality of cylindrical first holes in a metal plate to extend from a first lateral side surface of the metal plate to a second lateral side surface of the metal plate opposed to the first lateral side surface so as to extend parallel to a principal surface of the metal plate, a plurality of cooling channels being formed in inner portions of the first holes away from the first and second lateral side surfaces;

milling second holes to extend between the principal surface and the inner portions of the respective first holes disposed between plug areas disposed adjacent the first and second lateral side surfaces and arranged on each side of a central area of the metal plate overlying cylindrical portions of the first holes and adapted to be bonded to one or more sputter tiles wherein each of the second holes extends to a respective plurality of the first holes, wherein each of the second holes axially extends only along a respective first axis extending through the principal surface; and inserting plugs into, filling, and fluid sealing ends of the first holes in the plug areas.

16. The backing plate of claim 15, wherein the process further comprises bonding one of more target tiles to the central area of the metal plate and the second holes are milled in at least one principal surface in areas of the metal plate outside of the central area.

17. The target of claim 1, wherein the inlet and holes are disposed between the target area and outside edges of the metal plate.

18. The sputtering target of claim 1 configured to have the backing plate to be sealed to a vacuum chamber wherein the target area of one of the principal surfaces is disposed inside the vacuum chamber and the inlet and outlet slots formed in the at least one of the principal surfaces are disposed outside the vacuum chamber.

19. The target of claim 1, wherein the cooling holes extend laterally from a first edge of the backing plate to an opposed second edge of the backing plate.

20. The target of claim 4, wherein the cooling holes extend laterally from a first edge of the backing plate to an opposed second edge of the backing plate.

21. The target of claim 15, wherein each of the second holes extends only along a respective milling axis from the principal surface to a respective plurality of the first holes.

22. The target of claim 15, wherein two of the second holes extend to opposed axial sides of the respective pluralities of the first holes.

23. The target of claim 1, wherein a pair of one of the inlet holes and of one of the outlet holes extend respectively to opposed ends across the target area of one of the pluralities of the cooling holes.

* * * * *